United States Patent [19]

Shimada et al.

[11] 4,262,268

[45] Apr. 14, 1981

[54] COMPOSITE PI-SECTION LC FILTER ASSEMBLY AND METHOD OF MANUFACTURE

[75] Inventors: Moriyoshi Shimada, Takasaki; Takashi Onishi, Haruna, both of Japan

[73] Assignee: Taiyo Yuden Co., Ltd., Tokyo, Japan

[21] Appl. No.: 47,628

[22] Filed: Jun. 11, 1979

[30] Foreign Application Priority Data

Jun. 22, 1978 [JP] Japan .................................. 53-75688

[51] Int. Cl.³ .......................... H03H 7/01; H03H 3/00
[52] U.S. Cl. ...................................... 333/182; 361/302
[58] Field of Search ....................... 333/182, 183, 184; 361/302

[56] References Cited

U.S. PATENT DOCUMENTS 3,538,464  11/1970  Walsh .................................... 333/182
3,702,422  11/1972  Schor .................................... 333/182

Primary Examiner—Eli Lieberman
Attorney, Agent, or Firm—Woodcock, Washburn, Kurtz, Mackiewicz & Norris

[57] ABSTRACT

An assembly of several discrete pi-section LC filter units includes two capacitor assemblies each comprising a ceramic plate having several openings formed therein, isolated electrodes formed on one of the opposite faces of the ceramic plate so as to encircle all but one of the openings, respectively, formed therein, and a common electrode formed on the other face of the ceramic plate. Metal rods extend through the respective openings in the ceramic plates of the capacitor assemblies and through respective ferrite tubes interposed therebetween. All but one of the metal rods are soldered to the respective isolated electrodes of each capacitor assembly, and the remaining one metal rod, passing through said one of the openings in each ceramic plate, is soldered to the common electrodes for grounding same. All the soldered joints are formed by melting rings of solder fitted over the metal rods.

3 Claims, 13 Drawing Figures

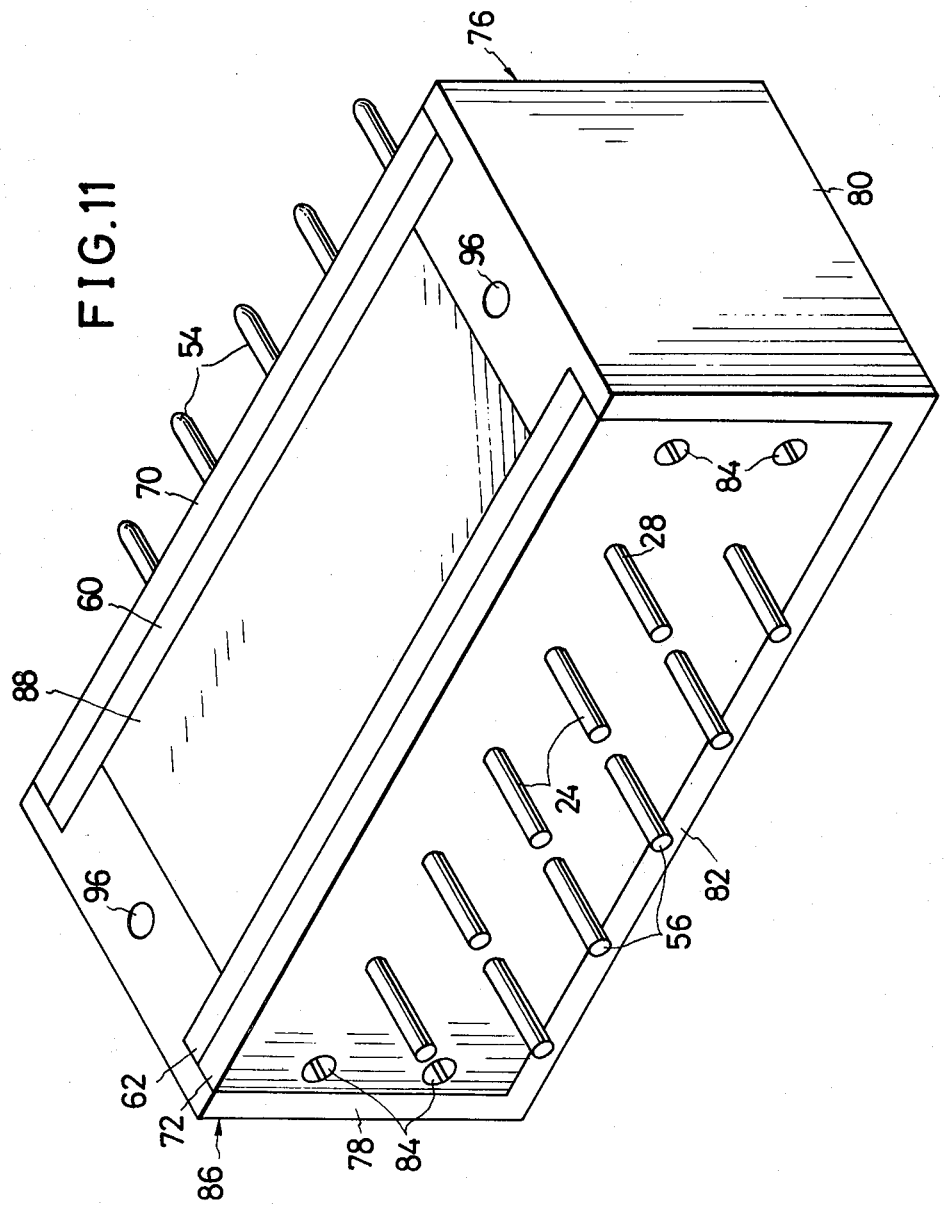

COMPOSITE PI-SECTION LC FILTER ASSEMBLY AND METHOD OF MANUFACTURE

BACKGROUND OF THE INVENTION

1. Field of the Invention

This invention relates to electric wave filters, to pi-section filters and, in particular, to a composite filter assembly integrally comprising a plurality of discrete pi-section LC filter units. The invention is also specifically directed to a method of manufacturing such a composite pi-section LC filter assembly. The filter assembly according to the invention finds use as a noise filter to suppress high frequency noise in a transmission path, among other applications.

2. Description of the Prior Art

The transmission of signals through the input-output device of a microcomputer, for example, necessitates the elimination of high frequency noise above two megahertz. This is possible by inserting pi-section LC filters in the transmission lines. By the pi-section LC filter is meant the filter comprising, in its simplest form, two capacitors and an inductance element connected to form a pi-network. It has been known to integrate these elements into a compact filter, as the combination of the individual elements would make the filter bulky and expensive.

Since the transmission path for a microcomputer comprises a plurality or multiplicity of lines, however, as many filters must be installed in juxtaposition. The use of individual pi-section LC filters in this and other comparable applications is therefore objectionable in view of their large space requirement and the trouble involved in connecting them to the respective lines. The total installation cost of the individual filters is also consideralby high.

SUMMARY OF THE INVENTION

It is an object of this invention to integrate a plurality of pi-section LC filter units into a compact, inexpensive filter assembly.

Another object of the invention is to provide such a composite pi-section LC filter assembly which is simplified and mechanically stable in construction and easy of assemblage.

A further object of the invention is to provide such a composite pi-section LC filter assembly which can be readily connected to desired transmission lines.

It is also an object of this invention to provide a method of expeditiously manufacturing or assemblying such a composite pi-section LC filter assembly.

In summary the composite pi-section LC filter assembly according to the invention includes at least two capacitor assemblies disposed opposite to each other. Each capacitor assembly comprises a dielectric plate having a plurality of openings formed therein, a plurality of isolated electrodes formed on one of the opposite faces of the dielectric plate and lying adjacent the respective openings formed therein, and a common electrode formed on the other face of the dielectric plate and having portions lying opposite to at least parts of the isolated electrodes. Rod-shaped conductors extend respectively through the corresponding openings in the dielectric plates and through tubular magnetic members interposed between the dielectric plates, with the opposite end portions of the conductors projecting out of the capacitor assemblies. The rod-shaped conductors are mechanically and electrically connected to the respective isolated electrodes on each dielectric plate. The filter assembly further includes means for electrically connecting the common electrodes to an external circuit.

Such being the construction of the filter assembly according to the invention, the corresponding end portions of the several rod-shaped conductors are to be inserted into a receptacle, and the wires or conductors of a desired circuit may be soldered to the other end portions of the rod-shaped conductors. The filter assembly may thus be used as a connector half.

Although the capacitor assemblies incorporated in the filter assembly are each substantially flat in shape, the filter assembly as a whole has sufficient mechanical strength to withstand the stresses of handling that it may encounter in use. This is because the rod-shaped conductors pass through the capacitor assemblies and are rigidly connected thereto as by soldering, thereby serving to brace same.

Moreover, with the tubular magnetic members interposed between the capacitor assemblies and sleeved upon the respective rod-shaped conductors, the filter assembly is minimized in size. The tubular magnetic members provide inductances in coaction with the rod-shaped conductors. Preferably the rod-shaped conductors are arranged in two or more rows, depending upon their number, for both the compactness and increased mechanical strength of the filter assembly.

In a preferred embodiment an additional rod-shaped conductor extends through additional openings in the dielectric plates. The additional rod-shaped conductor is mechanically and electrically connected, also as by soldering, to the common electrodes of the capacitor assemblies for grounding same. This is another factor contributing to the structural simplicity and compactness of the filter assembly.

According to the inventive method for the manufacture or assemblage of the filter assembly, the rod-shaped conductors are inserted into and through the respective openings in the dielectric plate of one of the capacitor assemblies, then the respective tubular magnetic members, and then the respective openings in the dielectric plate of the other capacitor assembly. The rod-shaped conductors are then mechanically and electrically connected, as by soldering, to the respective isolated electrodes of each capacitor assembly. The capacitor assemblies themselves can be fabricated in any known or suitable manner.

Preferably, for soldering the rod-shaped conductors to the isolated electrodes and for soldering the noted grounding rod-shaped conductor to the common electrodes, rings of solder are fitted in position over these conductors when the latter are inserted into and through the dielectric plate openings and the tubular magnetic members. The complete assembly is then heated to melt the solder rings, thereby simultaneously soldering the first recited rod-shaped conductors to the isolated electrodes and the grounding conductor to the common electrodes. The filter assembly can thus be manufactured through a simple and expeditious procedure, either manually or automatically.

The above and other objects, features and advantages of this invention and the manner of attaining them will become more readily apparent, and the invention itself will best be understood, from the following detailed description and appended claims, taken in connection

BRIEF DESCRIPTION OF THE DRAWINGS

FIG. 11 is a perspective view showing the encased filter assembly of FIG. 9 after filling the casing with the insulating material, the latter having been introduced in molten state into the casing through its open side and molded in situ;

DETAILED DESCRIPTION OF THE INVENTION

Figure 1:
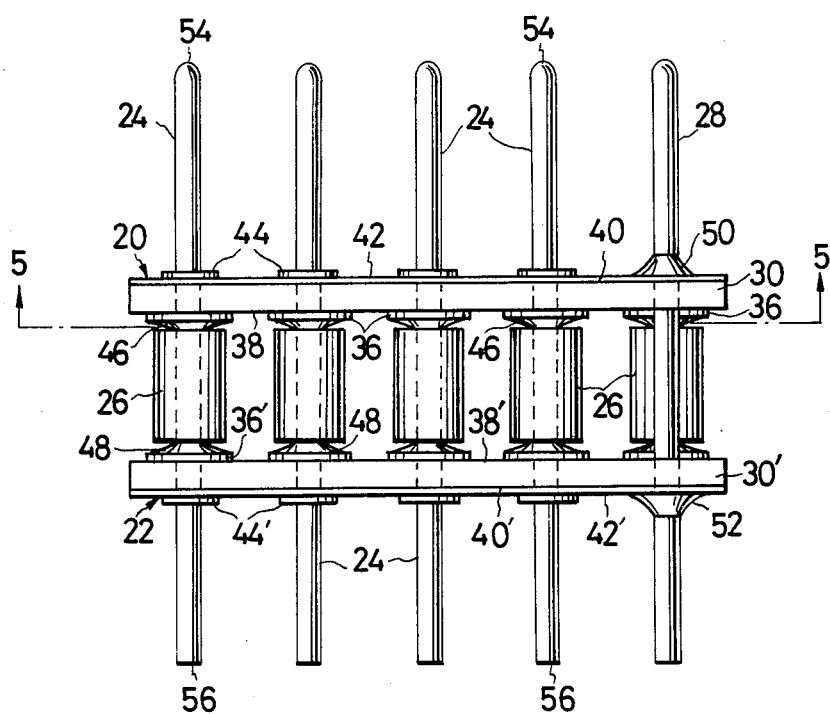
FIG. 1 is an elevational view of a preferred form of the composite pi-section LC filter assembly according to this invention.
Figure 2:
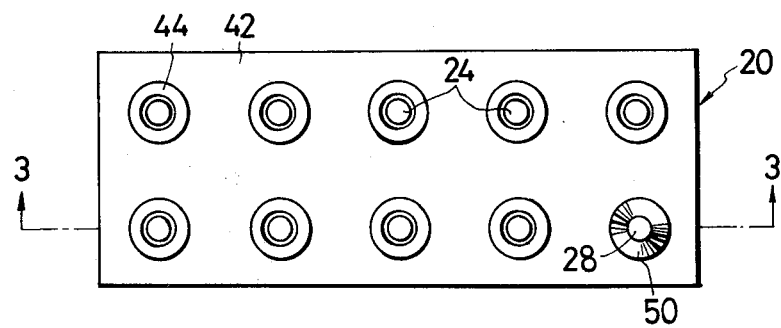
FIG. 2 is a top plan view of the filter assembly of FIG. 1.
Figure 3:
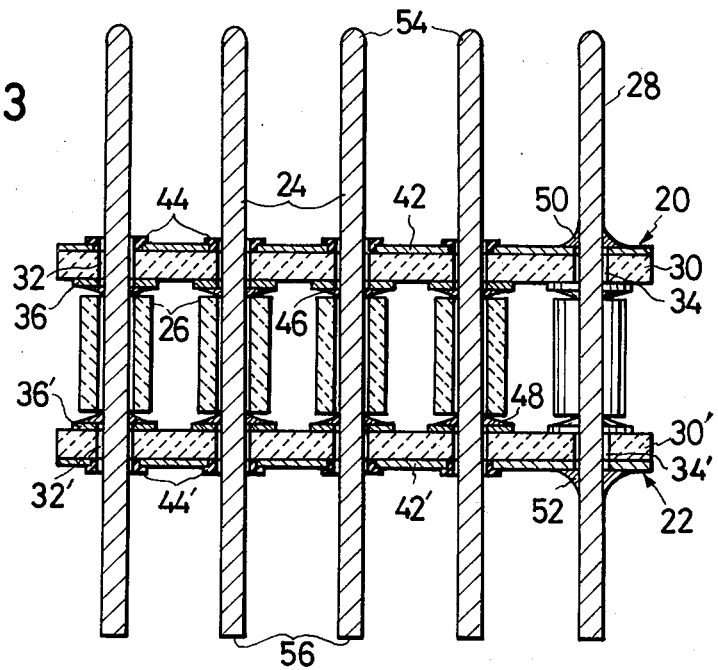
FIG. 3 is a vertical sectional view of the filter assembly taken along the line 3—3 in FIG. 2.
Figure 4:
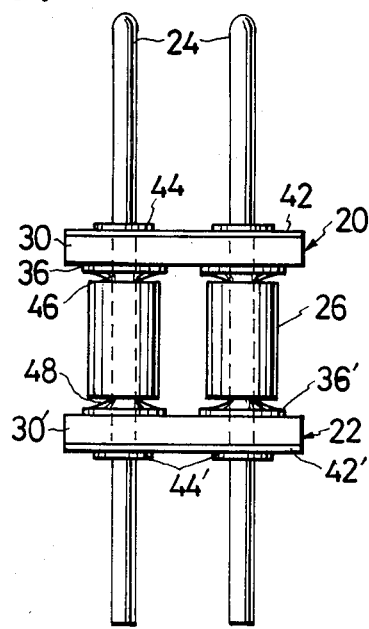
FIG. 4 is the left hand side elevational view of the filter assembly of FIG. 1.

With reference to FIGS. 1 through 5 the preferred form of the composite pi-section LC filter assembly according to this invention boardly comprises: (1) two capacitor assemblies 20 and 22 each including a plurality of capacitors and disposed opposite to each other; (2) a plurality of metal rods or rod-shaped conductors 24 extending through the capacitor assemblies and acting in part to mechanically interconnect them in spaced-apart positions; (3) ferrite tubes or tubular magnetic members 26 disposed between the capacitor assemblies and sleeved upon the respective metal rods to provide inductances in coaction therewith; and (4) another metal rod 28 also extending through the capacitor assemblies for purposes hereinafter referred to.

The two capacitor assemblies 20 and 22 can be exactly identical in construction, so that only one of them, 20, will be described in detail. Various parts of the other capacitor assembly 22 will be identified by priming the reference numerals used to designate the corresponding parts of the representative capacitor assembly 20, it being understood that the following description of this capacitor assembly 20 applies directly to the other capacitor assembly 22.

The representative capacitor assembly 20 includes a rectangular dielectric plate 30, as of ceramic, which has a plurality of openings or holes 32 and an additonal hole 34 (FIG. 3) formed therethrough in any suitable relative placement. As will be seen also from FIG. 2, the illustrated embodiment shows a total of ten such holes 32 and 34 arranged in two rows, each row consisting of five holes constantly spaced from one another. Although identical in shape and size with the other holes 32, the hole 34 is so designated to facilitate the following description of this pi-section LC filter assembly.

Figure 5:
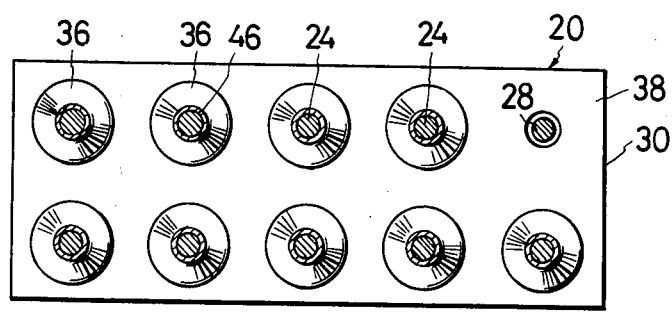
FIG. 5 is a horizontal sectional view of the filter assembly taken along the line 5—5 in FIG. 1.

Further included in the representative capacitor assembly 20 are a plurality of (nine in the illustrated embodiment) isolated or electrically disconnected electrodes 36 formed on one, 38, of the opposite faces of the dielectric plate 30 so as to surround the respective holes 32, as best seen in FIG. 5. This face 38 of the dielectric plate 30 confronts the corresponding face 38' of the dielectric plate 30' of the other capacitor assembly 22.

Overlying the other face 40 of the dielectric plate 30 is a common electrode 42 which includes portions lying opposite to at least parts of the isolated electrodes 36 across the dielectric layer to form capacitors. Flanged rings or tubes of insulating material are mounted at 44 to provide insulations between common electrode 42 and metal rods 24.

The two capacitor assemblies 20 and 22 of the foregoing configuration are rigidly interconnected in their spaced-apart positions by the metal rods 24 and 28. The metal rods 24 extend respectively through the corresponding ones of the holes 32 and 32' in the dielectric plates 30 and 30', and the other metal rod 28 extends through the holes 34 and 34' in the dielectric plates. The metal rods 24 further extend through the respective ferrite Tubes 26 interposed between the capacitor assemblies 20 and 22. Besides providing inductances in combination with the metal rods 24, the ferrite tubes 26 serve as spacers between the capacitor assemblies 20 and 22 in this particular embodiment.

The metal rods 24 are soldered at 46 and 48 to the respective isolated electrodes 36 and 36' of the capacitor assemblies 20 and 22 for both mechanical and electrical connection thereto. The other metal rod 28 is soldered to 50 and 52 to the common electrodes 42 and 42' of the capacitor assemblies 20 and 22 for grounding same and is thus also mechanically and electrically connected thereto.

All the metal rods 24 and 28 have their opposite end portions projecting beyond the capacitor assemblies 20 and 22, terminating in rounded ends 54 on the one hand and in blunt ends 56 on the other. The rounded end portions of the metal rods 24 and 28 are intended for ready insertion into a corresponding receptacle in the use of this filter assembly. The blunt-ended portions of the metal rods are to be coiled with and soldered to external wires or conductors. If desired, therefore, these blunt-ended portions of the metal rods may be flattened. All the metal rods should be sufficiently sturdy to withstand the stresses to be exerted thereon in use.

Figure 6:
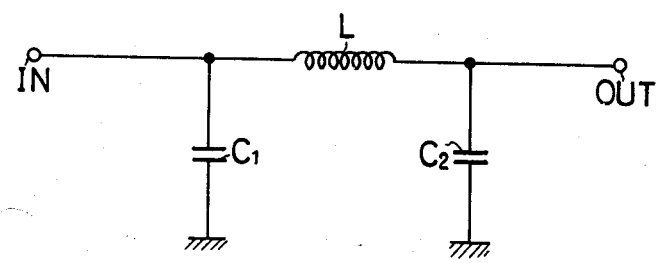
FIG. 6 is a schematic diagram of the equivalent circuit of each pi-section filter unit of the filter assembly of FIG. 1.

FIG. 6 schematically represents the equivalent circuit of each pi-section LC filter unit of the composite filter assembly constructed as in the foregoing. In this equivalent circuit the line extending from input terminal IN to output terminal OUT corresponds to one of the metal rods 24. The input terminal IN corresponds to the rounded end 54 of each metal rod 24, and the output terminal OUT corresponds to its blunt end 56. The inductance L represents that provided by the combination of each metal rod 24 and the corresponding one of the ferrite tubes 26 sleeved thereon.

The capacitor C1 in the equivalent circuit of FIG. 6 represents that formed by the combination of each isolated electrode 36 and the common electrode 42, separated by the dielectric plate 30, of the capacitor assembly 20. The other capacitor C2 represents that formed by the combination of each isolated electrode 36' and the common electrode 42', separated by the dielectric plate 30', of the other capacitor assembly 22. The isolated electrodes 36 and 36' of both capacitors C1 and C2 are electrically connected to one of the matal rods 24 via the soldered joints 46 and 48 and thus to the input IN and output OUT terminals as well as to the inductance L therebetween. The common electrodes 42 and 42' of the capacitors C1 and C2 are both electrically connected to the metal rod 28 via the soldered joints 50 and 52. As will be apparent from FIG. 6, the metal rod 28 serves to ground the common electrodes 42 and 42'.

This particular LC filter assembly is intended for elimination of unwanted frequencies above two megahertz. Toward this end the capacitances of the capacitors C1 and C2 are both set at 2000 picofarads, and the inductance L at one microhenry.

Figure 8:
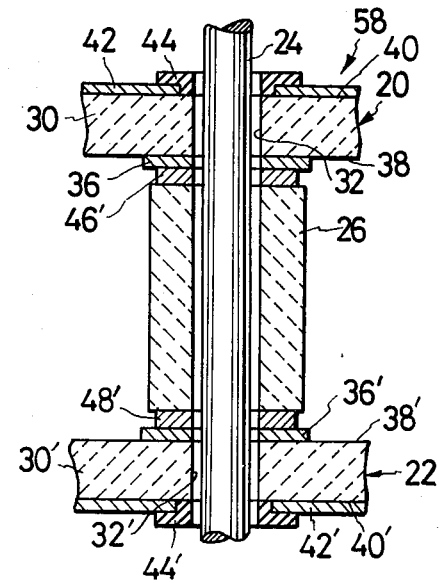
FIG. 8 is an enlarged, fragmentary vertical sectional view of the semifinished filter assembly of FIG. 7, the view showing one of the pi-section filter units.
Figure 7:
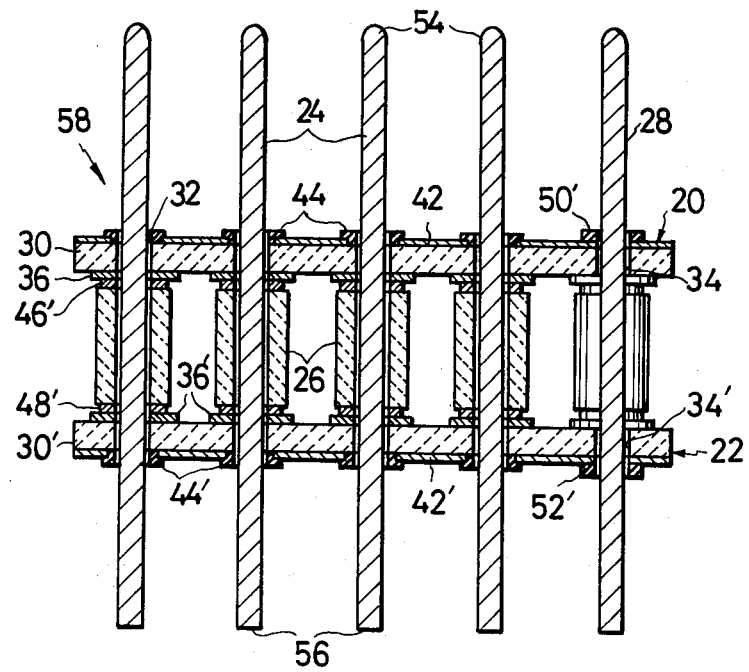
FIG. 7 is a view similar to FIG. 3 but showing the filter assembly in a semifinished state, the view being explanatory of the method of manufacturing the filter assembly according to the invention.

What follows is the description of the method of manufacturing or assemblying the composite pi-section LC filter assembly of FIGS. 1 through 5 in accordance with this invention. The two capacitor assemblies 20 and 22 may each be fabricated in any known or suitable manner, which is believed apparent to the specialists. There are also prepared the nine ferrite tubes 26 and the ten metal rods 24 and 28. Further, as seen in FIGS. 7 and 8, there are prepared nine solder rings 46', another nine solder rings 48', and additional two solder rings 50' and 52'. All these solder rings 46', 48', 50' and 52' can be identical in shape and size.

For the assemblage of the filter assembly the nine metal rods 24 are inserted, with their rounded ends 54 foremost, into and through the respective holes 32' in the dielectric plate 30' of the capacitor assembly 22, the respective solder rings 48', the respective ferrite tubes 26, the respective solder rings 46', and the respective holes 32 in the dielectric plate 30 of the capacitor assembly 20, in that order. Perhaps simultaneously the grounding metal rod 28 is inserted, also with its rounded end foremost, into and through the solder ring 52', the hole 34' in the dielectric plate 30', the hole 34 in the dielectric plate 30, and the solder ring 50', in that order.

FIGS. 7 and 8 show the semifinished filter assembly produced as above, which is generally labeled 58. In this simifinished filter assembly 58 the faces 38 and 38' of the dielectric plates 30 and 30', carrying the isolated electrodes 36 and 36' thereon, confront each other. Thus the nine solder rings 46' lie next to, and preferably in close contact with, the respective isolated electrodes 36 of the capacitor assembly 20, and the other nine solder rings 48' lie next to the respective isolated electrodes 36' of the capacitor assembly 22. The two additional solder rings 50' and 52' lie next to the respective common electrodes 42 and 42' of the capacitor assemblies 20 and 22. The ferrite tubes 26 serve to maintain the solder rings 46' and 48' in the above desired positions, besides acting as spacers between the capacitor assemblies 20 and 22.

With the projecting end portions of the metal rods 24 and 28 held by a jig of heat-resisting material, the entire simifinished filter assembly 58 is then heated in an oven to melt all the solder rings 46', 48', 50' and 52'. The composite pi-section LC filter assembly of FIGS. 1 through 5 is completed upon solidification of the solder.

In the thus-completed filter assembly the solder rings 46' have turned into the machanical and electrical joints 46 between metal rods 24 and isolated electrodes 36; the solder rings 48' into the joints between metal rods 24 and isolated electrodes 36'; the solder ring 50' into the joint 50 between grounding metal rod 28 and common electrode 42; and the solder ring 52' into the joint 52 between grounding metal rod 28 and common electrode 42'.

The possibility of the molten solder intruding into the holes 32, 32', 34 and 34' in the dielectric plates 30 and 30' can be substantially eliminated by minimizing or eliminating the clearances with which the metal rods 24 and 28 extend through these holes and through the isolated electrodes 36 and 36' and the common electrodes 42 and 42'. The minimization of the clearances is also effective to afford the positive mechanical and electrical joints 46, 48, 50 and 52 between the metal rods 24 and 28 and the isolated and common electrodes 36, 36', 42 and 42'.

Even if the molten solder intrudes to some extent into the holes 32 and 32' in the dielectric plates 30 and 30', it will not come to short-circuit the isolated electrodes 36 and 36' and the common electrodes 42 and 42'. This is because the insulating rings or tubes 44 and 44' are provided to insulate the metal rods 24 from the common electrodes 42 and 42'.

The filter assembly of FIGS. 1 through 5 is of such rugged construction, with its two capacitor assemblies 20 and 22 mechanically interconnected by the ten metal rods 24 and 28 in two rows, that it can be put to use as such, without incorporating any further reinforcing or enclosing means. The means of FIGS. 9 through 12 may be employed, however, if it is desired to make the filter assembly sturdier in construction and easier to handle.

Figure 9:
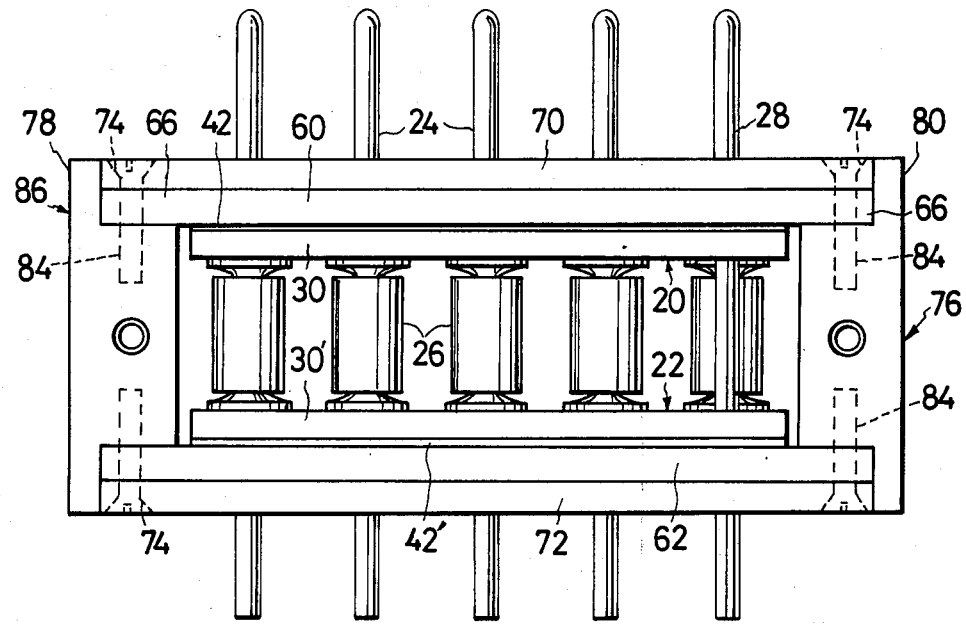
FIG. 9 is an elevational view showing the filter assembly of FIG. 1 as enclosed in a casing having one side open, preparatory to filling the casing with moldable insulating material.

With reference to FIG. 9 a pair of rectangular grounding plates 60 and 62 of conducting material, usually metal, are first attached to the respective common electrodes 42 and 42' of the capacitor assemblies 20 and 22. Solder or conductive adhesive may be adopted to secure the grounding metal plates 60 and 62 to the respective common electrodes 42 and 42' in electrically conducting relationship.

Figure 10:
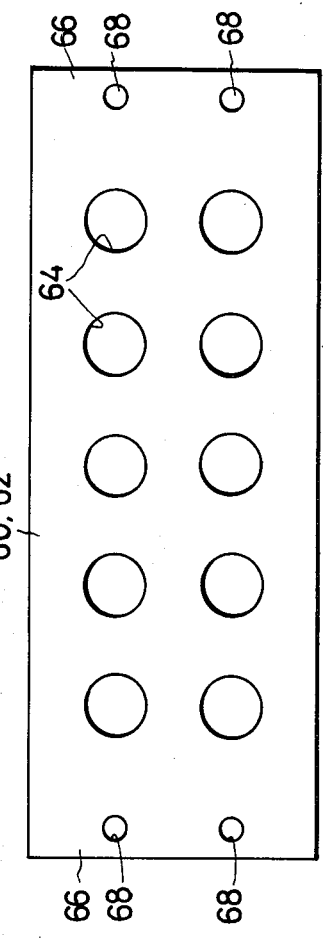
FIG. 10 is a plan view of one of a pair of grounding metal plates forming parts of the casing shown in FIG. 9.

As shown in FIG. 10, each of the grounding metal plates 60 and 62 has formed therein ten holes 64 for permitting the passage of the metal rods 24 and 28 therethrough and for receiving the isolated electrodes 36 or 36' and the soldered joint 50 or 52. Each grounding metal plate has opposite end portions 66 projecting beyond the longitudinal ends of the corresponding dielectric plate 30 or 30'. A pair of screw holes 68 are formed in each of these projecting end portions 66 of the grounding metal plate.

Referring again to FIG. 9 a pair of plates 70 and 72 of insulating material are then placed over the respective grounding metal plates 60 and 62. These insulating plates 70 and 72 can be of the same shape and size as the grounding metal plates 60 and 62. Each insulating plate has also formed therein ten holes (not seen in FIG. 9) of a diameter just sufficient to permit the passage of the metal rods 24 and 28 therethrough. Also formed in each insulating plate are two pairs of countersunk screw holes 74 in register with the screw holes 68 in the grounding metal plates 60 and 62.

As will be seen also from FIG. 11, a U-shaped frame 76 of conductive material, preferably metal, is then mounted on and engaged with the grounding metal plates 60 and 62 and insulating plates 70 and 72. The metal frame 76 comprises a pair of confronting, recessed side walls 78 and 80 and a bottom wall 82 bridging the side walls. Countersunk screws 84 pass through the aligned holes 68 and 74 in the grounding metal plates 60 and 62 and insulating plates 70 and 72 and are threadedly engaged in corresponding holes in the side walls 78 and 80 of the metal frame 76.

There has now been completed a casing generally designated 86 in FIGS. 9 and 11. This casing 86, having one side open, encloses the capacitor assemblies 20 and 22, the ferrite tubes 26, and parts of the metal rods 24 and 28.

An insulating, moldable material such as epoxy resin is then introduced in molten state into the casing 86 through its open side. This material is molded in place to provide an insulating filling, seen at 88 in FIG. 11, within the casing 86.

Figure 12:
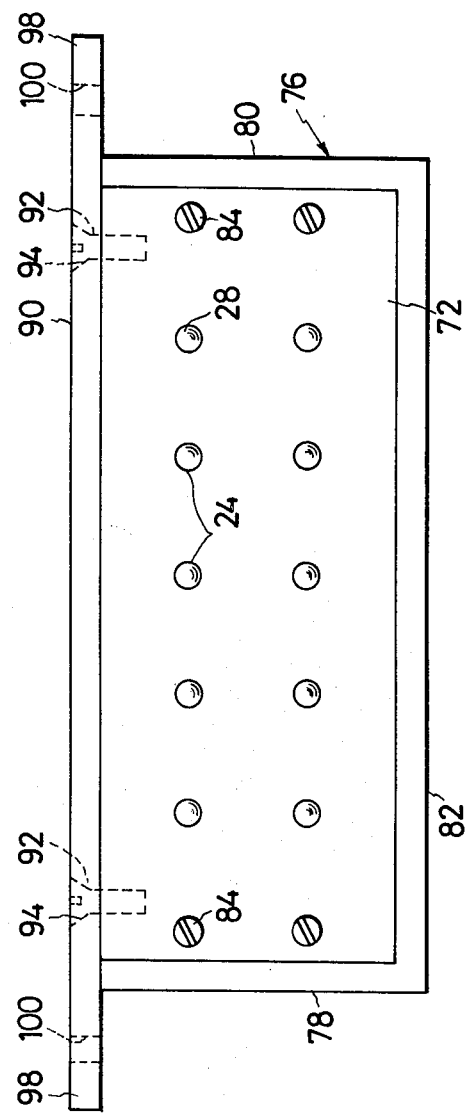
FIG. 12 is an elevational view of the completed filter assembly, with lid mounted on the article of FIG. 11 to close the open side of the casing.

Then, as shown in FIG. 12, a lid 90 of conductive material, preferably metal, is placed on the open side of the casing 86. This metal lid is fastened to the casing 86 by a pair of countersunk screws 92 passing through holes 94 in the lid and threadedly engaged in holes 96 (FIG. 11) formed in the side walls 78 and 80 of the metal frame 76. The opposite longitudinal end portions 98 of the metal lid 90 project beyond the side walls 78 and 80 of the metal frame 76. A mounting hole or holes 100 are formed in each of these projecting end portions 98 of the metal lid 90.

In the use of the encased and reinforced LC filter assembly completed as above, the metal lid 90 of its casing 86 is to be fastened to a grounded mounting section of desired equipment, as by means of screw or like fasteners passing through the mounting holes 100 in the lid. The round-ended portions of the metal rods 24 and 28 may be inserted into a corresponding receptacle, and their blunt-ended portions may be suitably connected to the conductors of the equipment circuitry. With its casing 86 having the insulating filling 88, the filter assembly of FIG. 12 is notable for its high mechanical strength and ease of handling.

The casing 86 of this filter assembly includes the pair of grounding metal plates 60 and 62 in direct contact with the metal frame 76 and the metal lid 90. The grounding metal rod 28 may therefore be omitted if the common electrodes 42 and 42' of the capacitor assemblies 20 and 22 can be positively grounded through the grounding metal plates 60 and 62.

Figure 13:
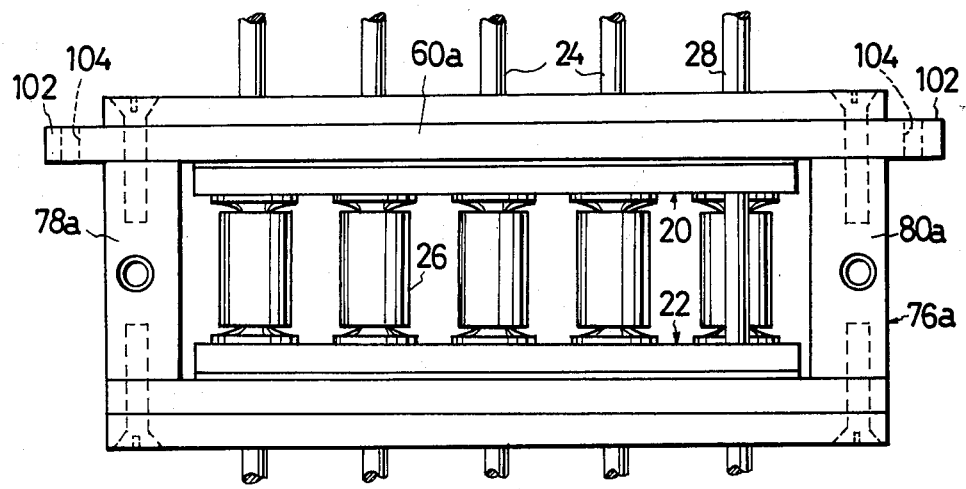
FIG. 13 is a view corresponding to FIG. 9 but showing an alternative form of the casing for the filter assembly of FIG. 1.

FIG. 13 shows an alternative construction corresponding to FIG. 9. The construction of FIG. 13 differs from that of FIG. 9 in its grounding metal plate 60a which has opposite longitudinal end portions 102 projecting beyond the side walls 78a and 80a of a U-shaped metal frame 76a of correspondingly modified shape. Mounting holes 104 are formed in these projecting end portions of the grounding metal plate 60a. The other details of construction can be identical with those of the filter assembly of FIGS. 9 through 12, except for the length of a lid to be mounted on the structure of FIG. 13 after filling the casing with an insulating material.

The modified filter assembly of FIG. 13 is to be mounted in position by fastening the grounding metal plate 60a to the chassis or panel of the input-output device of desired equipment as by means of screws passing through its mounting holes 104. In this modified filter assembly, too, the grounding metal rod may be omitted if the common electrodes can be positively grounded through the grounding metal plates.

Although the present invention has been shown and described in specific terms, it will be easy for those skilled in the art to devise a variety of modifications or changes in the construction, and method of manufacture, of the composite pi-section LC filter assembly disclosed herein. For example, in the construction of the filter assembly shown in FIGS. 1 through 5, the common electrodes of the two capacitor assemblies may be formed on the confronting faces of the dielectric plates, and the isolated electrodes may be formed on the other faces of the dielectric plates. Further the ferrite tubes may be disposed at spacings from the capacitor assemblies, instead of being used as spacers therebetween as in the illustrated embodiment. If desired, moreover, rings of conductive material may be interposed between the metal rods and the isolated electrodes to aid in the formation of firm soldered joints therebetween.

The construction of the filter assembly shown in FIGS. 9 through 12 and its modification shown in FIG. 13 are also subject to additional modifications or alterations. For example, instead of providing the illustrated casing, a molded enclosure of eopxy resin, flass or like insulating material may be formed directly on the filter assembly of FIGS. 1 through 5 so as to leave exposed only the opposite end portions of the metal rods. As an additional alternative such a molded enclosure may be formed only with the grounding metal plates of the casing mounted in place on the filter assembly of FIGS. 1 through 5.

It is also to be noted that the filter assembly according to the invention may not necessarily incorporate only two capacitor assemblies as in the illustrated embodiments. Three or more capacitor assemblies, with ferrite tubes interposed between the adjacent assemblies, could be integrally combined to provide a filter assembly within the scope of the invention. In this case each of the filter units making up the filter assembly includes two or more inductive pi-networks in series.

Further, in the method of manufacturing the filter assembly according to the invention, the metal rods may not necessarily be soldered to the isolated and common electrodes of the capacitor assemblies by heating the solder rings fitted over the metal rods. Although this measure is preferable to expedite the manufacturing process, it is also possible to connect the metal rods to the capacitor electrodes by other methods such as dip soldering or the coating of a conductive adhesive.

All these and other modifications or changes are intended in the foregoing disclosure. It is therefore appropriate that the present invention be construed broadly and in a manner consistent with the fair meaning or proper scope of the following claims.

What is claimed is:

1. An electric filter assembly integrally including a plurality of pi-section filter units, comprising:
   (a) at least two capacitor assemblies disposed opposite to each other, each capacitor assembly comprising:
      (1) a dielectric plate having formed therein a plurality of openings of suitable relative placement;
      (2) a plurality of isolated electrodes formed on one of the opposite faces of the dielectric plate and situated adjacent the respective openings formed therein; and (3) a common electrode formed on the other face of the dielectric plate having portions lying opposite to at least parts of the isolated electrodes;

(b) a plurality of rod-shaped conductors extending respectively through the corresponding openings in the dielectric plates of the capacitor assemblies and soldered to the respective isolated electrodes of each capacitor assembly to establish mechanical and electrical connections thereto, each rod-shaped conductor having opposite end portions projecting beyond the capacitor assemblies;

(c) a plurality of annular insulating members interposed between the rod-shaped conductors and the common electrodes of the capacitor assemblies to provide electrical insulation therebetween.

(d) a plurality of tubular magnetic members sleeved upon the respective rod-shaped conductors and disposed between the capacitor assemblies;

(e) an additional rod-shaped conductor extending through additional openings formed in the dielectric plates of the capacitor assemblies in register with each other, the additional rod-shaped conductor being mechanically and electrically connected to the common electrodes of the capacitor assemblies and also having opposite end portions projecting beyond the capacitor assemblies; and (f) means enclosing the capacitor assemblies, the tubular magnetic members, and parts of all the rod-shaped conductors.

2. A method of manufacturing an electric filter assembly integrally including a plurality of pi-section filter units, which comprises:

(a) providing at least two capacitor assemblies each comprising a dielectric plate having formed therein a plurality of openings of suitable relative placement, a plurality of isolated electrodes formed on one of the opposite faces of the dielectric plate so as to surround respectively all but one of the openings formed therein, and a common electrode formed on the other face of the dielectric plate and having portions lying opposite to at least parts of the isolated electrodes;

(b) inserting a plurality of rod-shaped conductors respectively into and through all but said one of the openings in the dielectric plate of one of the capacitor assemblies, a first group of solder rings, tubular magnetic members, a second group of solder rings, and all but said one of the openings in the dielectric plate of the other capacitor assembly;

(c) inserting an additional rod-shaped conductor into and through an additional solder ring, said one of the openings in the dielectric plate of one of the capacitor assemblies, said one of the openings in the dielectric plate of the other capacitor assembly, and another additional solder ring;

(d) thereby forming a semifinished filter assembly wherein the first group of solder rings lie next to the respective isolated electrodes of said one of the capacitor assemblies, wherein the second group of solder rings lie next to the respective isolated electrodes of said other capacitor assembly, and wherein the two additional solder rings lie next to the respective common electrodes of the capacitor assemblies; and (e) melting all the solder rings of the semifinished filter assembly, whereby upon solidification of the solder, mechanical and electrical connections are established between the first recited rod-shaped conductors and the isolated electrodes of the capacitor assemblies and between the additional rod-shaped conductor and the common electrodes of the capacitor assemblies.

3. A method of manufacturing an electric filter assembly according to claim 2, wherein the solder rings are melted by heating the entire semifinished filter assembly.

* * * * *